(12) United States Patent
Weltsch et al.

(10) Patent No.: US 10,749,288 B2
(45) Date of Patent: Aug. 18, 2020

(54) FLEXIBLE LIQUID-COOLING ASSEMBLY FOR HIGH-POWER PLUGGABLE CONNECTORS

(71) Applicant: Mellanox Technologies, Ltd., Yokneam (IL)

(72) Inventors: Oren Weltsch, Harish (IL); Alexei Berkovich, Pardes Hana-Karkur (IL)

(73) Assignee: MELLANOX TECHNOLOGIES, LTD., Yokneam (IL)

(*) Notice: Subject to any disclaimer, the term of this patent is extended or adjusted under 35 U.S.C. 154(b) by 0 days.

(21) Appl. No.: 16/381,005

(22) Filed: Apr. 11, 2019

(65) Prior Publication Data

US 2020/0006884 A1 Jan. 2, 2020

Related U.S. Application Data

(60) Provisional application No. 62/690,987, filed on Jun. 28, 2018.

(51) Int. Cl.
*G06F 1/20* (2006.01)
*H01R 13/514* (2006.01)
*B23P 19/04* (2006.01)

(52) U.S. Cl.
CPC ............ *H01R 13/514* (2013.01); *B23P 19/04* (2013.01)

(58) Field of Classification Search
CPC ...... H05K 1/0272; H05K 1/0209; H05K 7/20; G06F 1/20; H01R 13/514; B23P 19/04

USPC .................................................. 439/485, 487
See application file for complete search history.

(56) References Cited

U.S. PATENT DOCUMENTS

| | | | |
|---|---|---|---|
| 6,679,315 B2* | 1/2004 | Cosley | F25B 39/022 165/104.21 |
| 6,987,668 B2* | 1/2006 | Kitano | G06F 1/203 165/104.33 |
| 7,342,789 B2* | 3/2008 | Hall | G06F 1/20 165/104.19 |
| 7,907,398 B2* | 3/2011 | Hrehor, Jr. | H05K 7/20254 165/104.33 |
| 8,493,735 B2* | 7/2013 | Iijima | G06F 1/20 361/679.53 |
| 9,406,586 B2* | 8/2016 | Suzuki | H01L 23/473 |
| 9,786,578 B2 | 10/2017 | Cox et al. | |
| 2017/0135246 A1 | 5/2017 | Lunsman et al. | |

* cited by examiner

Primary Examiner — Hien D Vu
(74) Attorney, Agent, or Firm — Kligler & Associates Patent Attorneys Ltd

(57) ABSTRACT

A liquid-cooling assembly includes two or more cooling sub-assemblies and a flexible interconnect assembly. The two or more cooling sub-assemblies are configured for cooling two or more respective pluggable connector-cages, each cooling sub-assembly including (i) a heat-conducting plate for coupling to a respective pluggable connector-cage, and (ii) a liquid-conducting channel having an inlet and an outlet for flowing cooling liquid. The flexible interconnect assembly is configured to transfer the cooling liquid to and from inlets and outlets of the cooling sub-assemblies, and to mechanically support the cooling sub-assemblies while permitting motion of the cooling sub-assemblies relative to one another.

14 Claims, 3 Drawing Sheets

FLEXIBLE LIQUID-COOLING ASSEMBLY FOR HIGH-POWER PLUGGABLE CONNECTORS

CROSS-REFERENCE TO RELATED APPLICATIONS

This application claims the benefit of U.S. Provisional Patent Application 62/690,987, filed Jun. 28, 2018, whose disclosure is incorporated herein by reference.

FIELD OF THE INVENTION

The present invention relates generally to removing heat from pluggable electrical connectors, and particularly to liquid-cooling of pluggable electrical connectors.

BACKGROUND OF THE INVENTION

Electronic assemblies may employ means capable of removing heat from assembled electronic devices. For example, U.S. Patent Application Publication 2017/0135246 describes an apparatus and a method for cooling electronic components. An apparatus includes a connector and an electronic component that plugs into the connector. The electronic component contacts a heat sink, where the heat sink moves in an upward direction as the electronic component is plugged into the connector. Soft thermal pads located between the heat sink and liquid cooling tubes/pipes compress as the heat sink moves upward. When compressed, the thermal pads contact the heat sink and the liquid cooling tubes/pipes. Heat is then transferred from the electronic component through the heat sink, through the thermal pads, through the coolant tubes, and into liquid contained within the liquid coolant tubes.

As another example, U.S. Pat. No. 9,786,578 describes a memory module cooling system that includes a liquid cooled manifold assembly and a heat spreader assembly rotateably attached to the liquid cooled manifold assembly about an axis perpendicular to the memory module. The liquid cooled manifold assembly includes a manifold, a liquid inlet, and a liquid outlet. The heat spreader assembly includes a base in thermal contact with a heat pipe, and a heat spreader in thermal contact with the heat pipe, the heat spreader configured to thermally engage the memory module. In certain embodiments, thermal bonds are maintained between a plurality of neighboring memory modules when a particular heat spreader assembly is rotated away from an associated memory module.

SUMMARY OF THE INVENTION

An embodiment of the present invention provides a liquid-cooling assembly including two or more cooling sub-assemblies and a flexible interconnect assembly. The two or more cooling sub-assemblies are configured for cooling two or more respective pluggable connector-cages, each cooling sub-assembly including (i) a heat-conducting plate for coupling to a respective pluggable connector-cage, and (ii) a liquid-conducting channel having an inlet and an outlet for flowing cooling liquid. The flexible interconnect assembly is configured to transfer the cooling liquid to and from inlets and outlets of the cooling sub-assemblies, and to mechanically support the cooling sub-assemblies while permitting motion of the cooling sub-assemblies relative to one another.

In some embodiments, the flexible interconnect assembly is configured to transfer the cooling liquid in series between the inlets and the outlets of the two or more cooling sub-assemblies.

In some embodiments, the flexible interconnect assembly includes tubes that are configured to transfer the cooling liquid and are interwoven with each other.

In an embodiment, the flexible interconnect assembly permits vertical motion of the cooling sub-assemblies relative to one another by the tubes being interwoven with each other.

In another embodiment, the flexible interconnect assembly includes soft interconnecting hoses configured to transfer the cooling liquid.

In some embodiments, the flexible interconnect assembly permits vertical motion of the cooling sub-assemblies relative to one another.

In some embodiments, the flexible interconnect assembly is configured to prevent vertical motion caused by plugging or unplugging a cable into one of the pluggable connector-cages from affecting another of the pluggable connector-cages.

In an embodiment, the flexible interconnect assembly and the two or more cooling sub-assemblies are attached to one another with screws.

There is additionally provided, in accordance with an embodiment of the present invention, a manufacturing method, including attaching to two or more pluggable connector-cages two or more respective cooling sub-assemblies for cooling the two or more respective pluggable connector-cages, each cooling sub-assembly including (i) a heat-conducting plate for coupling to a respective pluggable connector-cage, and (ii) a liquid-conducting channel having an inlet and an outlet for flowing cooling liquid. A flexible interconnect assembly is coupled to the two or more cooling sub-assemblies, wherein the flexible interconnect assembly is configured to transfer the cooling liquid to and from inlets and outlets of the cooling sub-assemblies, and to mechanically support the cooling sub-assemblies while permitting motion of the cooling sub-assemblies relative to one another.

The present invention will be more fully understood from the following detailed description of the embodiments thereof, taken together with the drawings in which:

DETAILED DESCRIPTION OF EMBODIMENTS

Overview

Figure 1:
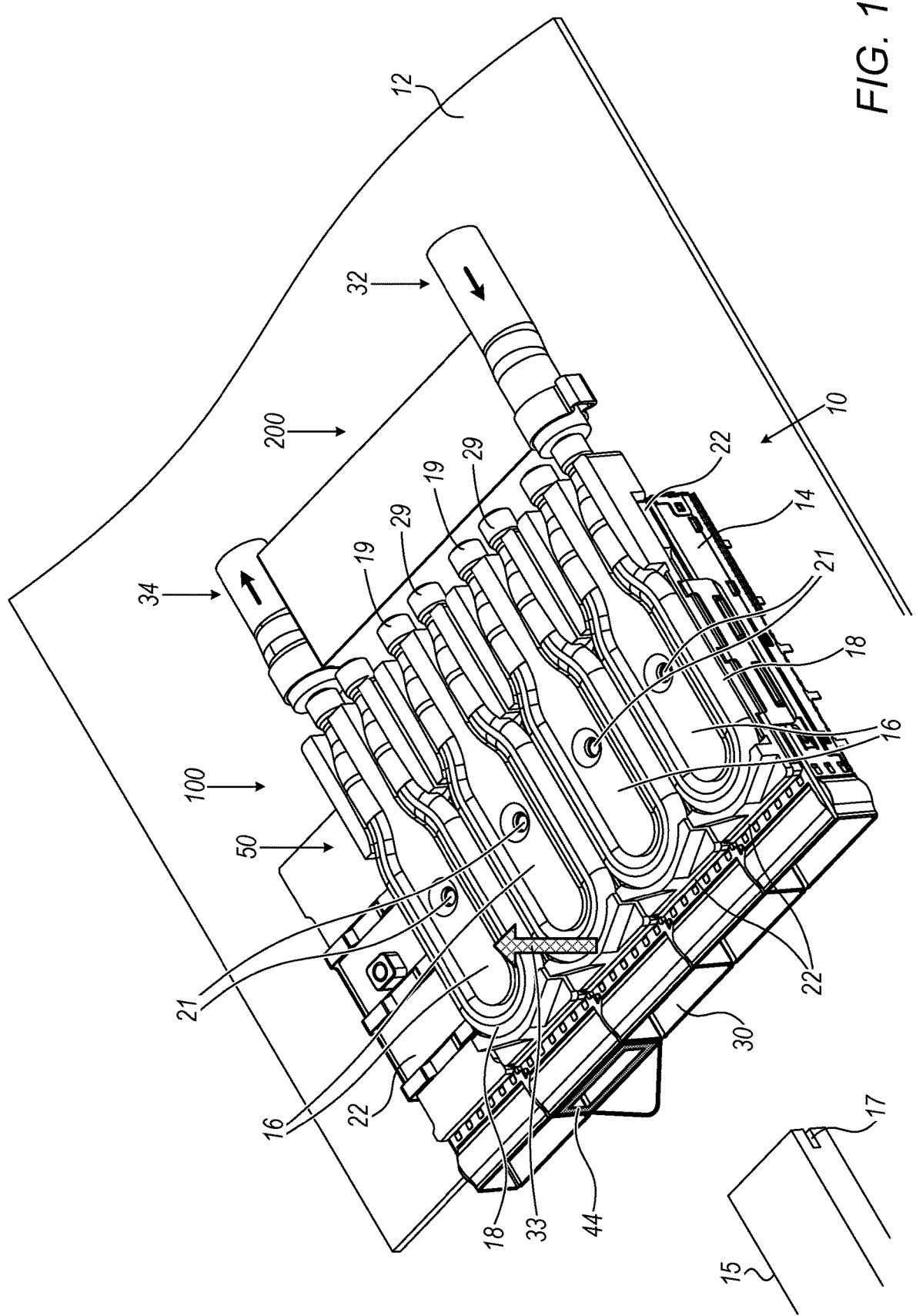
FIG. 1 is an isometric view of a liquid-cooled connector-cage assembly, in accordance with an embodiment of the present invention.

Pluggable connector-cages of high-end electronic cards, such as network adapters, are required for high rate data transfer (e.g., 100 Gb/Sec) and are thus required to reliably function at high electrical powers, e.g., each on the order of several watts or more. A high-end network adapter may include multiple socket modules that are tightly grouped together in one or more multiple-cage connector-cages, such as in multiple-cage Quad Small Form-factor Pluggable (QSFP) cages. Each of the socket modules typically comprises temperature-sensitive semiconductor devices, such as lasers and amplifiers, which require cooling. At high data rates, air cooling methods may be insufficient, and in particular, the very limited space between cards inside a unit may challenge the applicability of effective air-cooling methods.

As a result, liquid cooling may be sought. However, liquid cooling solutions may also suffer from limited applicability due to the limited space available. For example, a liquid cooling solution may require hoses and tubing to supply cooling fluid to each of the multiple connector-cages on a card, which is impractical to integrate in multiple electronic cards that are densely packed together.

A possible solution that reduces the number of hoses is to use a single cold plate (e.g., a liquid-cooled heat-conducting plate) that is attached to a multiple-cage connector-cage hosting several socket modules, one socket module in each cage. Unfortunately, when a cable connector is hot swapped (i.e., being plugged in or unplugged from a socket module), mechanical forces mediated by the shared cold plate may cause unacceptable temporary loss of thermo-mechanical contact between the heat-conducting plate and neighboring socket modules, which could harm or degrade the temperature-sensitive semiconductor devices inside the socket modules. Furthermore, it is at least in principle possible that such hot swapping would also cause mechanical motion that would interrupt data traffic flowing through neighboring socket modules, due to the shared cold plate.

A particular reason for the possible occurrence of such loss of thermo-mechanical contact in socket modules of a multiple-cage QSFP connector-cage is that the top facet of the QSFP connector-cage moves up and down during plugging and unplugging, thereby moving its cold plate. The movement of the rigid cold plate causes top facets of neighboring cages of the multiple-cage QSFP connector-cage to move similarly and to lose thermo-mechanical contact with a respective socket module inside each cage.

The isolation of vertical motion also holds when two or more single cages are used on a card, rather than multiple-cage connector-cages, as long as the two or more single cages share a single flexible liquid-cooling assembly. In the description hereinafter both types of connector-cages used are termed a "connector-cage assembly."

To overcome transient disconnects of thermo-mechanical contact due to hot swapping, liquid-cooling solutions may include flexible mediation materials, such as thermal pads, between the cold plate and individual heat sinks (i.e., one per cage) of the multiple-cage connector-cage. However, a thermal pad considerably increases the thermal impedance between the cage and the cold plate, which reduces the heat removal performance of the liquid-cooling based thermal solution. Moreover, thermal pads may increase the overall thickness of the thermal solution, which may not be possible to implement in cases of limited spacing between cards.

Embodiments of the present invention that are described hereinafter provide inherently flexible liquid-cooling assemblies and design methods of inherently flexible liquid-cooling assemblies to remove heat from connector-cage assemblies, such as multiple-cage QSFP connector-cage assemblies. The disclosed inherently flexible liquid-cooling assemblies maintain good thermo-mechanical contact with each individual connector-cage of the connector-cage assembly, while avoiding disconnects in thermo-mechanical contact of neighboring pluggable connector-cages when a hot swapping takes place.

In some embodiments, a disclosed flexible cooling assembly comprises: (a) two or more cooling sub-assemblies for cooling two or more respective socket module-pluggable connector-cages, each cooling sub-assembly comprising (i) a heat-conducting plate for coupling to a respective socket module-pluggable connector-cage, and (ii) a liquid-conducting channel having an inlet and an outlet for flowing cooling liquid, and (b) a flexible interconnect assembly, which is configured to transfer the cooling liquid to and from inlets and outlets of the cooling sub-assemblies, and to mechanically support the cooling sub-assemblies while permitting motion of the cooling sub-assemblies relative to one another. In an embodiment, the flexible liquid-cooling assembly is configured to cool the two or more respective pluggable connector-cages by transferring the cooling liquid in series between inlets and outlets of the two or more cooling sub-assemblies.

The disclosed flexible liquid-cooling assemblies are configured to isolate relative (e.g., vertical) motion between each of the cages of a multiple-cage connector-cage when hot swapping takes place. The height of the flexible interconnect assembly over a surface of a card does not exceed a given prespecified value, so as to conform with existing specifications that provide very limited space between cards inside a unit.

In some embodiments, the flexibility of a disclosed cooling assembly is achieved by the cooling assembly comprising interconnects, e.g., tubes (pipes), that are interwoven with each other. The interwoven interconnects pass cooling liquid to the series of firmly attached individual heat-conducting plates. The disclosed interwoven layout provides mechanical flexibility (e.g., elasticity) that prevents the vertical movement of neighboring conneceter-cages when a hot swapping takes place in one of the connector-cages that share the interwoven cooling assembly.

In general, various type of connector-cages (e.g., SFP, DD-SFP, SFP+, QSFP+, DD-QSFP, etc.) and various mechanical designs of the disclosed liquid-cooling assemblies are covered by embodiments of the present invention, where such mechanical designs may include different mechanical solutions to prevent the unintended relative (e.g., vertical) mechanical motion during hot swapping and resulting data traffic disconnects. For example, a design may use elastic elements, such as springs, and/or soft elements, such as soft liquid interconnects (e.g., silicon-rubber interconnecting hoses, with the silicon rubber either not reinforced or reinforced, for example, by being braided with metal wires).

The disclosed liquid-cooling assembly solutions, such as the interwoven tubing layout, may enable developing network adapters capable of sustaining data traffic at higher rates of data at higher respective electrical powers.

Flexible Liquid-Cooling Assembly for High-Power Pluggable Connectors

FIG. 1 is an isometric view of a liquid-cooled connector-cage assembly 10, in accordance with an embodiment of the present invention. Connector-cage assembly 10 may be part of a network element, such as a packet switch that requires large numbers of densely packed pluggable connector-cages to input and/or output large amount of data traffic.

Each such pluggable connector-cage 14 is configured to host a socket module 44 comprising heat sensitive photonic elements, such as opto-electronic transducers (e.g., semiconductor lasers and photodiodes). The main sources of heat are the semiconductor lasers (e.g., VCSELs or other laser sources). Each such socket module 44 (or the pluggable connector-cage itself) may also comprise electronic components, such as transimpedance amplifiers that amplify the photodiodes outputs. The photonic and electronic devices in a given cage may consume between several watts and over ten watts of electrical power, and therefore the densely packed connector-cages require each effective cooling of its hosted socket module 44.

As seen, by way of example, liquid-cooled connector-cage assembly 10, which is mounted on a card 12, comprises five individual pluggable connector-cages 14 packed together. Liquid-cooled connector-cage assembly 10 further comprises a flexible cooling assembly 100 comprising, by way of example, four cooling sub-assemblies 50 coupled to a flexible interconnect assembly 200. As seen, each cooling sub-assembly 50 comprises a heat-conducting plate 16. Cooling sub-assemblies 50 are fluid connected by flexible interconnect assembly 200, for example in series, as exemplified in FIG. 2.

Each pluggable connector-cage 14 comprises a receptacle 30 that can accept a socket module 44 that further accepts a cable plug 15 having electrical contacts and/or optical interconnects 17. During hot swapping, i.e., when a plug 15 is plugged in or unplugged, the top facet of the respective connector-cage temporarily moves upward and downward in a vertical direction 33. This vertical motion, unless isolated, causes top facets of neighboring connector-cages to similarly move, which may cause unacceptable transient disruptions in cooling of the neighboring socket modules 44 (not shown).

Each of the five connector-cages 14 has a heat sink plate 22 attached to a top facet of the connector-cage. Each heat-conducting plate 16 of cooling sub-assemblies 50 of flexible cooling assembly 100 is directly attached to a top facet of each of the four (out of five) heat sink plates 22. The fifth heat sink plate of the specific connector-cage assembly shown in FIG. 1 would receive cooling from a neighboring cooling assembly (not shown).

In general, the number of cages per connector-cage assembly and the number of cooling sub-assemblies per a flexible cooling assembly are each determined by engineering considerations, and each may vary independently of the other according to a particular design.

Each cooling sub-assembly 50 further comprises a C-shaped copper pipe 18 for flowing cooling liquid, which is embedded in a respective heat-conducting plate 16, so as to cool a respective connector-cage 14. As seen, each pipe 18 has an inlet 19 and an outlet 29 for flowing cooling liquid. The thickness of heat sink plates 22 and of heat-conducting plates 16 is limited due to limited space between cards inside a unit.

Copper tubes 18 cool, in series, connector-cages 14, by cooling liquid flowing inside tubes 18. The cooling fluid enters tubes 18 via an inlet 32 and exits via an outlet 34. As seen, tubes 18 extend beyond cooling plates in the opposite direction to receptacles 30 and are interconnected in a flexible interconnect assembly 200, to create the disclosed flexible cooling assembly 100. Flexible interconnect assembly 200 utilizes available space in otherwise densely packed cards that have no room for a more spacious thermal solution. In particular, flexible interconnect assembly 200 is located by design at almost the same height as connector cages 14, to conform with available space between cards.

In an embodiment described in FIG. 2 below, a flexible interconnect assembly is realized by interleaving tubes 18. However, flexible interconnect assembly 200 may comprise other solutions, such as using springs and/or soft interconnecting hoses that isolate relative (e.g., vertical) motion.

The isometric view shown in FIG. 1 is chosen purely for the sake of conceptual clarity. In the shown embodiment, flexible interconnect assembly 200 is placed at the back of cooling sub-assemblies 50. In other designs, the disclosed solution may have a different form and location, such as being a flexible assembly located on top of cooling sub-assemblies 50, if there is available space between cards. In general, a liquid-conducting channel for flowing cooling liquid, such as pipe 18, can be realized in various alternative ways than a pipe. For example, it can be realized as a closed channel or other lumen formed inside plate 16. Elements that are not mandatory for understanding of the disclosed mechanical isolation techniques, such as electrical components and interconnects, are omitted from the figure for simplicity of presentation.

Woven-Tube Liquid-Cooling Assembly for
High-Power Pluggable Connectors

Figure 2:
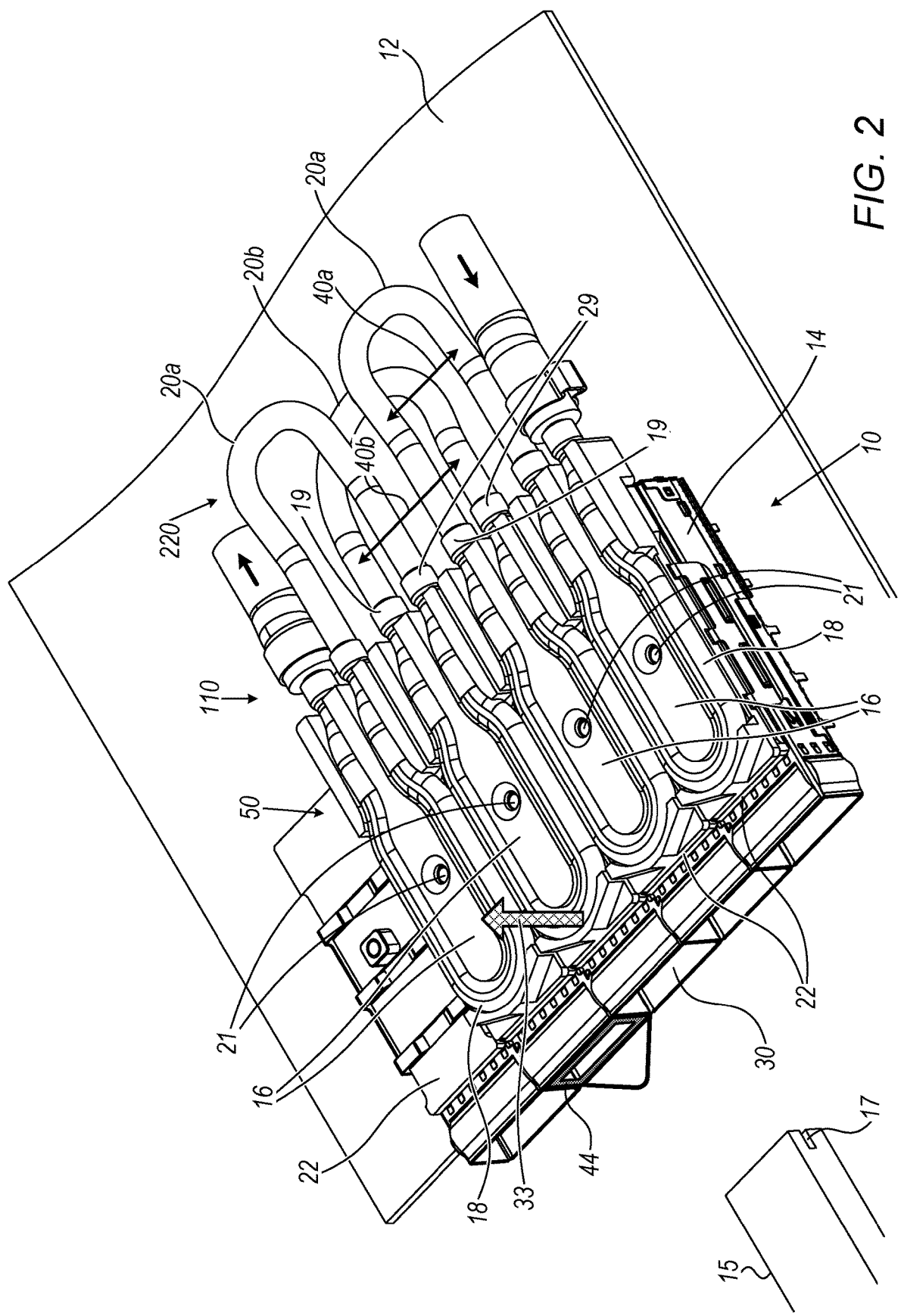
FIG. 2 is an isometric view of an interwoven-tube liquid-cooling assembly, in accordance with an embodiment of the present invention.

FIG. 2 is an isometric view of an interwoven-tube liquid-cooling assembly 110, in accordance with an embodiment of the present invention. Cooling assembly 110 comprises flexible interwoven interconnect assembly 220 of tubes, that is laterally located beyond heat-conducting plates 16 in the opposite direction to receptacles 30 of connector-cages 14. Interwoven interconnect assembly 220 is an embodiment of the more general concept of the flexible interconnect assembly 200 described in FIG. 1.

In the shown embodiment, copper tubes 18 cool connector-cages 14 in series, by cooling liquid flowing inside tubes 18. As seen, each pipe 18 has an inlet 19 and an outlet 29 for flowing the cooling liquid. In general, a cooling scheme may involve cooling at least part of connector-cages 14 in parallel. As seen, tubes 18 extend beyond heat-conducting plates 16 in the opposite direction to receptacles 30 and are interconnected by U-shaped pipes 20a and 20b that are interwoven with each other. U-shaped pipes 20a and 20b have respective apertures 40a and 40b between continuous sections of the longitudinal sections of tubes 20a and 20b. Apertures 40a and 40b are maximized by the weaving design of tubes 20a and 20b. The maximized apertures (i.e., maximized lengths 40a and 40b) maximize the required flexibility of interwoven interconnect assembly 220, and that flexibility enables the independent vertical movement of each of pluggable-cages 14.

In an embodiment, pipes 20a and 20b are made of copper. In other embodiments, pipes 20a and 20b may be made of another elastic material or made of a flexible material (e.g., silicon rubber), whichever materials are found to isolate pipes 20a and 20b from the vertical motion of each cooling sub-assembly 50.

Figure 3:
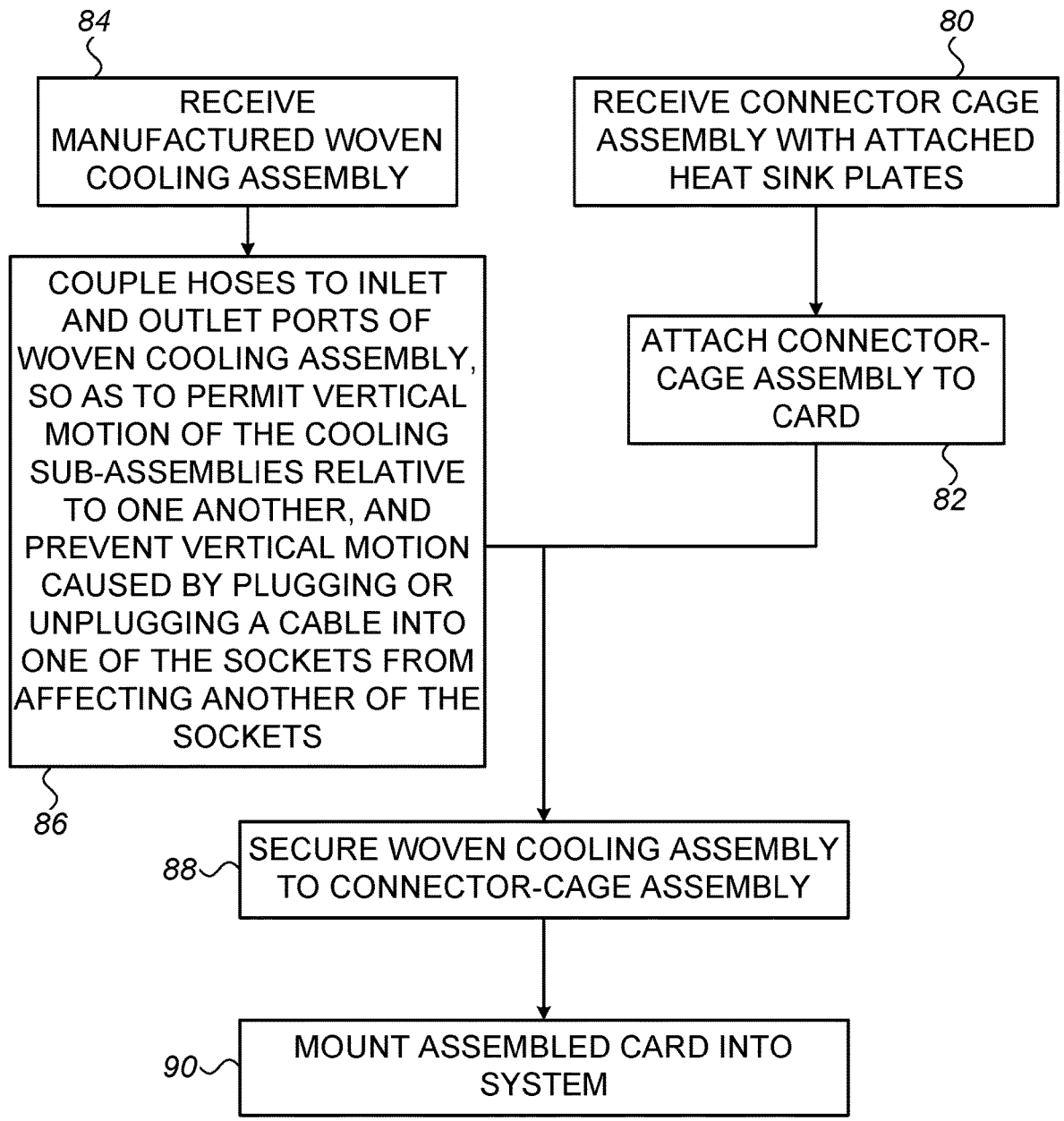
FIG. 3 is a flow chart that schematically illustrates a manufacturing method of the liquid-cooled connector-cage assembly of FIG. 2, in accordance with an embodiment of the present invention.

FIG. 3 is a flow chart that schematically illustrates a manufacturing method of interwoven-tube by liquid-cooled connector-cage assembly 110 of FIG. 2, in accordance with an embodiment of the present invention. The process begins at receiving, at a manufacturing step 82, a connector-cage assembly (e.g., a "cassette" of cages packed together) to which heat sink plates 22 were each attached at the top facet of each respective connector-cages 14 of the cage assembly. Next, the prepared connector-cage assembly with connector-cages 14 and plates 22 together, is attached (e.g., soldered) to card 12, at multiple-cage connector-cage attaching step 82.

The manufacturing process typically runs in parallel, with receiving a manufactured interwoven-tube cooling assembly 220, at a receiving step 84. Step 84 may include visually examining cooling assembly 220 and/or testing cooling assembly 220 for leakage. Next, hoses made of a flexible material, such as natural or synthetic rubbers, to absorb movement of cooling plate during the hot swapping are coupled to inlet 32 and outlet 34 of cooling assembly 110, at a fluid cooling assembly step 86.

At a securing step 88, interwoven-tube cooling assembly 220 is secured to plates 22 on top of connector-cages 14, for example, by using screws 21 to secure each of heat-conducting plates 16 to a respective heat sink plate 22. Finally, at an assembly step 90, the fluid cooling assembled card 12 is mounted into the system (i.e., into a unit in which cards similar to card 12 are densely packed).

The flow chart of FIG. 3 is brought by way of example. Such assembly process typically includes many steps and processes that are omitted for the sake of clarity. For example, details such as the type of the hose-connectors used for coupling the plastic hoses to inlet 32 and outlet 34 of cooling assembly 110, are omitted.

Although the embodiments described herein mainly address thermal solution connector-cage assemblies in use in high-end network adapters and other network elements, the methods and systems described herein can also be used for cooling other types of connector-cage assemblies that work under hot swapping conditions, such as those used in medical modalities.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A liquid-cooled connector assembly, comprising:
   two or more sockets, which are mounted side-by-side and are configured to receive two or more respective plugs, the sockets comprising electronic components that generate heat;
   two or more cooling sub-assemblies for evacuating at least some of the heat from the two or more respective sockets, each cooling sub-assembly comprising (i) a heat-conducting plate for coupling to a respective socket, and (ii) a liquid-conducting channel having an inlet and an outlet for flowing cooling liquid, thereby cooling the heat-conducting plate; and
   a flexible dual-purpose interconnect assembly, which is configured to both (i) transfer the cooling liquid to and from inlets and outlets of the cooling sub-assemblies, and (ii) mechanically support the cooling sub-assemblies while permitting motion of the side-by-side mounted sockets relative to one another.

2. The liquid-cooled connector assembly according to claim 1, wherein the flexible dual-purpose interconnect assembly is configured to transfer the cooling liquid in series between the inlets and the outlets of the two or more cooling sub-assemblies.

3. The liquid-cooled connector assembly according to claim 1, wherein the flexible dual-purpose interconnect assembly comprises tubes that are configured to transfer the cooling liquid and are interwoven with each other.

4. The liquid-cooled connector assembly according to claim 3, wherein the flexible dual-purpose interconnect assembly permits vertical motion of the side-by-side mounted sockets relative to one another by the tubes being interwoven with each other.

5. The liquid-cooled connector assembly according to claim 1, wherein the flexible dual-purpose interconnect assembly comprises soft interconnecting hoses configured to transfer the cooling liquid.

6. The liquid-cooled connector assembly according to claim 1, wherein the flexible dual-purpose interconnect assembly permits vertical motion of the side-by-side mounted sockets relative to one another.

7. The liquid-cooled connector assembly according to claim 1, wherein the flexible dual-purpose interconnect assembly is configured to prevent vertical motion caused by plugging or unplugging a cable into one of the sockets from affecting another of the sockets.

8. The liquid-cooled connector assembly according to claim 1, wherein the flexible dual-purpose interconnect assembly and the two or more cooling sub-assemblies are attached to one another with screws.

9. A manufacturing method, comprising:
   attaching to two or more sockets two or more respective cooling sub-assemblies for evacuating at least some of the heat from the two or more respective sockets, each cooling sub-assembly comprising (i) a heat-conducting plate for coupling to a respective socket, and (ii) a liquid-conducting channel having an inlet and an outlet for flowing cooling liquid, thereby cooling the heat-conducting plate; and
   coupling to the two or more cooling sub-assemblies a flexible dual-purpose interconnect assembly, which is configured to both (i) transfer the cooling liquid to and from inlets and outlets of the cooling sub-assemblies, and (ii) mechanically support the cooling sub-assemblies while permitting motion of the side-by-side mounted sockets relative to one another.

10. The manufacturing method according to claim 9, wherein cooling the sockets comprises transferring the cooling liquid in series between the inlets and the outlets of the two or more cooling sub-assemblies.

11. The manufacturing method according to claim 9, wherein coupling the flexible dual-purpose interconnect assembly comprises coupling tubes that are interwoven with each other.

12. The manufacturing method according to claim 11, wherein permitting vertical motion of the cooling sub-assemblies relative to one another by the flexible dual-purpose interconnect assembly comprises inter-weaving the tubes of the flexible interconnect assembly with each other.

13. The manufacturing method according to claim 9, wherein coupling the flexible dual-purpose interconnect assembly comprises coupling soft interconnecting hoses.

14. The manufacturing method according to claim 9, wherein coupling the flexible dual-purpose interconnect assembly comprises attaching the flexible dual-purpose interconnect assembly and the two or more cooling sub-assemblies to one another using screws.

\* \* \* \* \*